(12) United States Patent
Khoury et al.

(10) Patent No.: US 6,232,801 B1
(45) Date of Patent: May 15, 2001

(54) COMPARATORS AND COMPARISON METHODS

(75) Inventors: Elie Georges Khoury, Gibert; Richard W. Ulmer, Tempe, both of AZ (US)

(73) Assignee: VLSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/368,400

(22) Filed: Aug. 4, 1999

(51) Int. Cl.[7] .............................. G01R 19/00; G11C 7/00; H03F 3/45

(52) U.S. Cl. .................. 327/57; 327/55; 327/65; 327/72

(58) Field of Search ..................... 327/53, 55, 57, 327/65, 66, 67, 72, 77, 89

(56) References Cited

U.S. PATENT DOCUMENTS

| | | | |
|---|---|---|---|
| 4,237,387 | 12/1980 | Devendorf et al. | 327/223 |
| 4,418,290 | * 11/1983 | Nagano | 327/66 |
| 5,032,744 | 7/1991 | Wai Yeung Liu | 327/55 |
| 5,301,292 | 4/1994 | Hilton et al. | 395/425 |
| 5,719,525 | 2/1998 | Khoury | 327/562 |
| 5,786,808 | 7/1998 | Khoury | 345/161 |
| 5,856,748 | * 1/1999 | Seo et al. | 327/53 |
| 5,894,233 | * 4/1999 | Yoon | 327/55 |
| 6,008,673 | * 12/1999 | Glass et al. | 327/77 |

OTHER PUBLICATIONS

C. Toumazou et al., *Switched–Currents and Analogue Technique for Digital Technology*, 1993, p. 314.

David A. Johns et al., *Analog Integrated Circuit Design*, 1997, pp. 317–326.

* cited by examiner

*Primary Examiner*—Toan Tran
*Assistant Examiner*—Quani Tra
(74) *Attorney, Agent, or Firm*—Wells, St. John, Roberts, Gregory & Matkin, P.S.

(57) ABSTRACT

Comparators, memory devices, comparison methods and memory reading methods are provided. One aspect provides a comparator including an input stage having a data input adapted to receive a data voltage signal, a reference input adapted to receive a reference voltage signal, and a plurality of current sources individually coupled with one of the data input and the reference input and individually configured to convert one of the data voltage signal and the reference voltage signal to a differential current signal and to output the differential current signal; and a comparator stage including a plurality of inputs configured to receive the differential current signals from the input stage and the comparator stage being configured to compare the differential current signals and to output an output signal indicative of a comparison of the differential current signals.

35 Claims, 15 Drawing Sheets

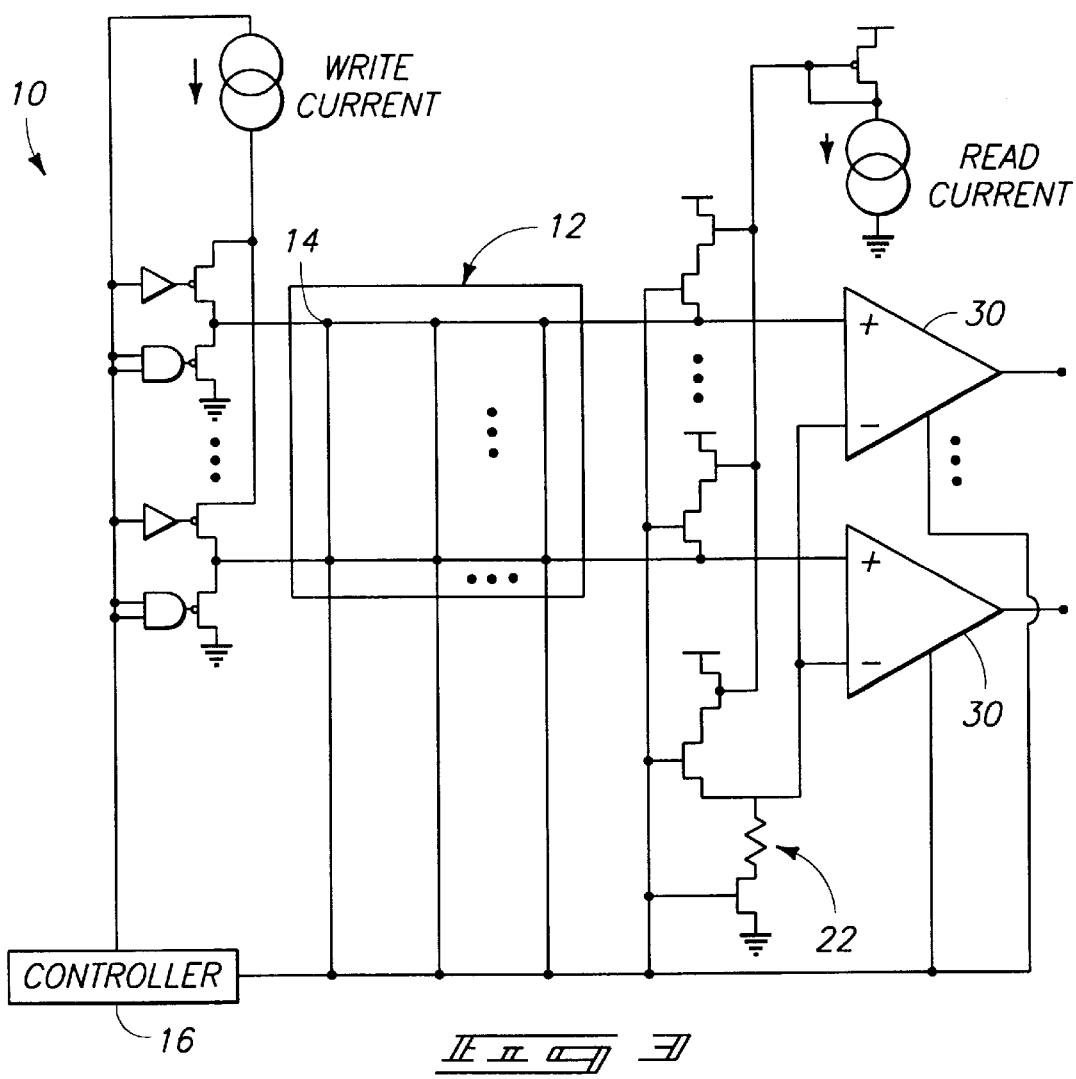
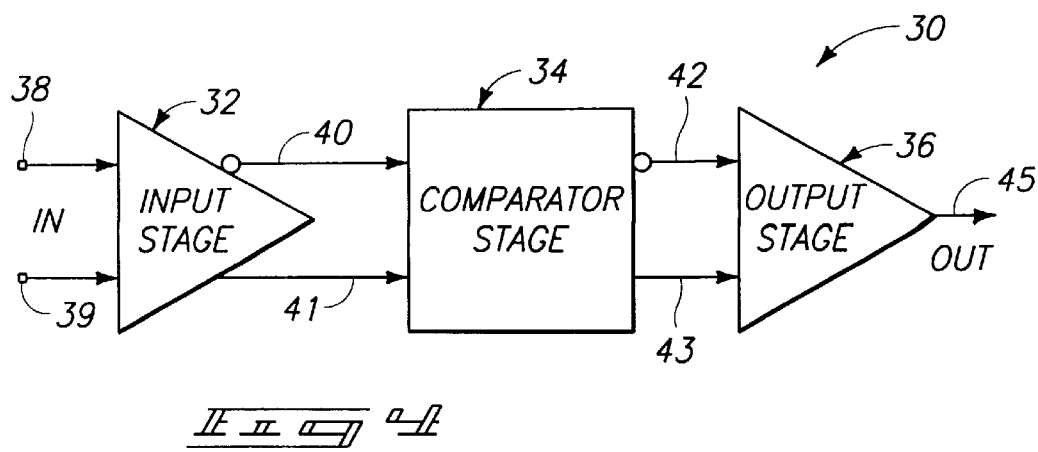

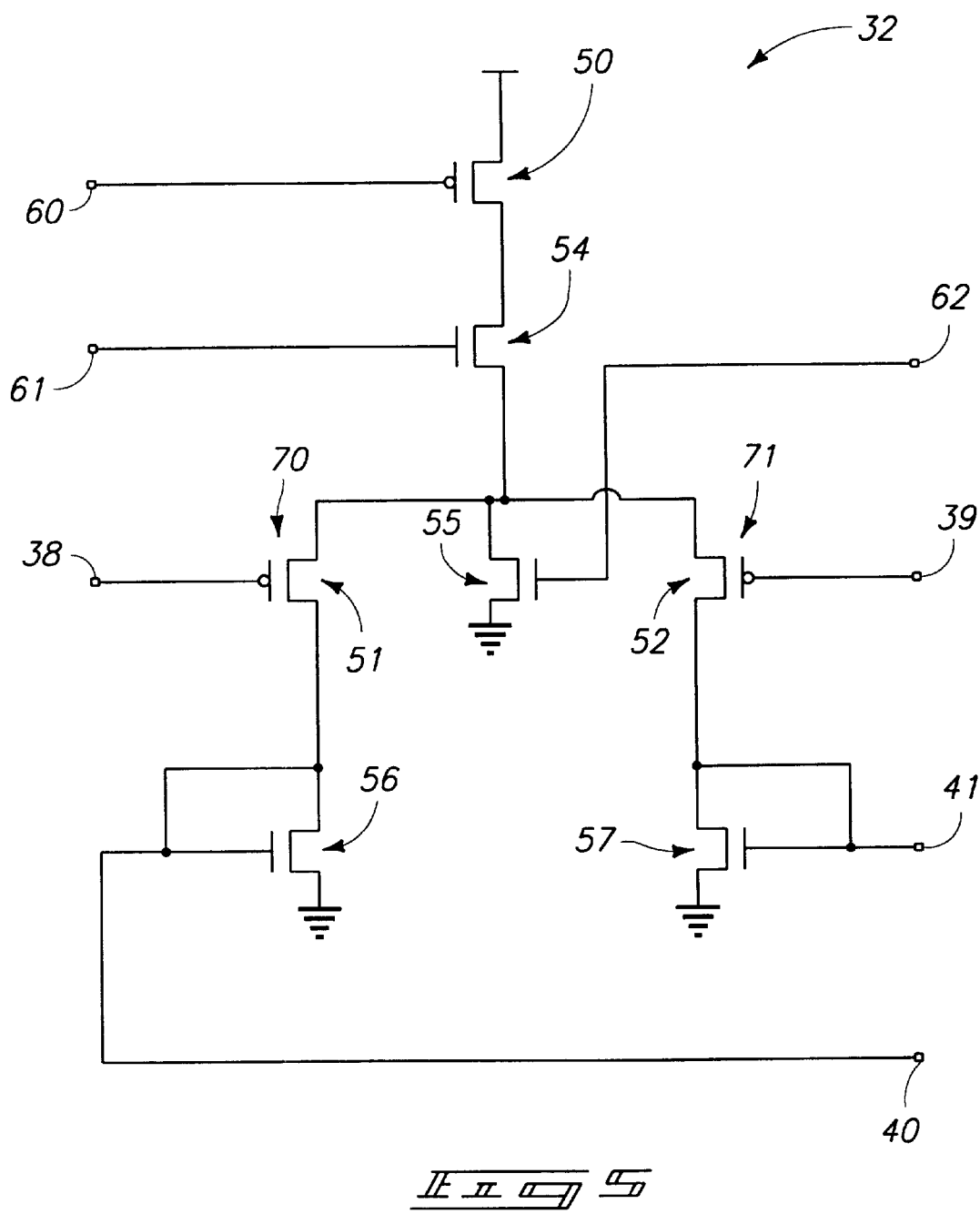

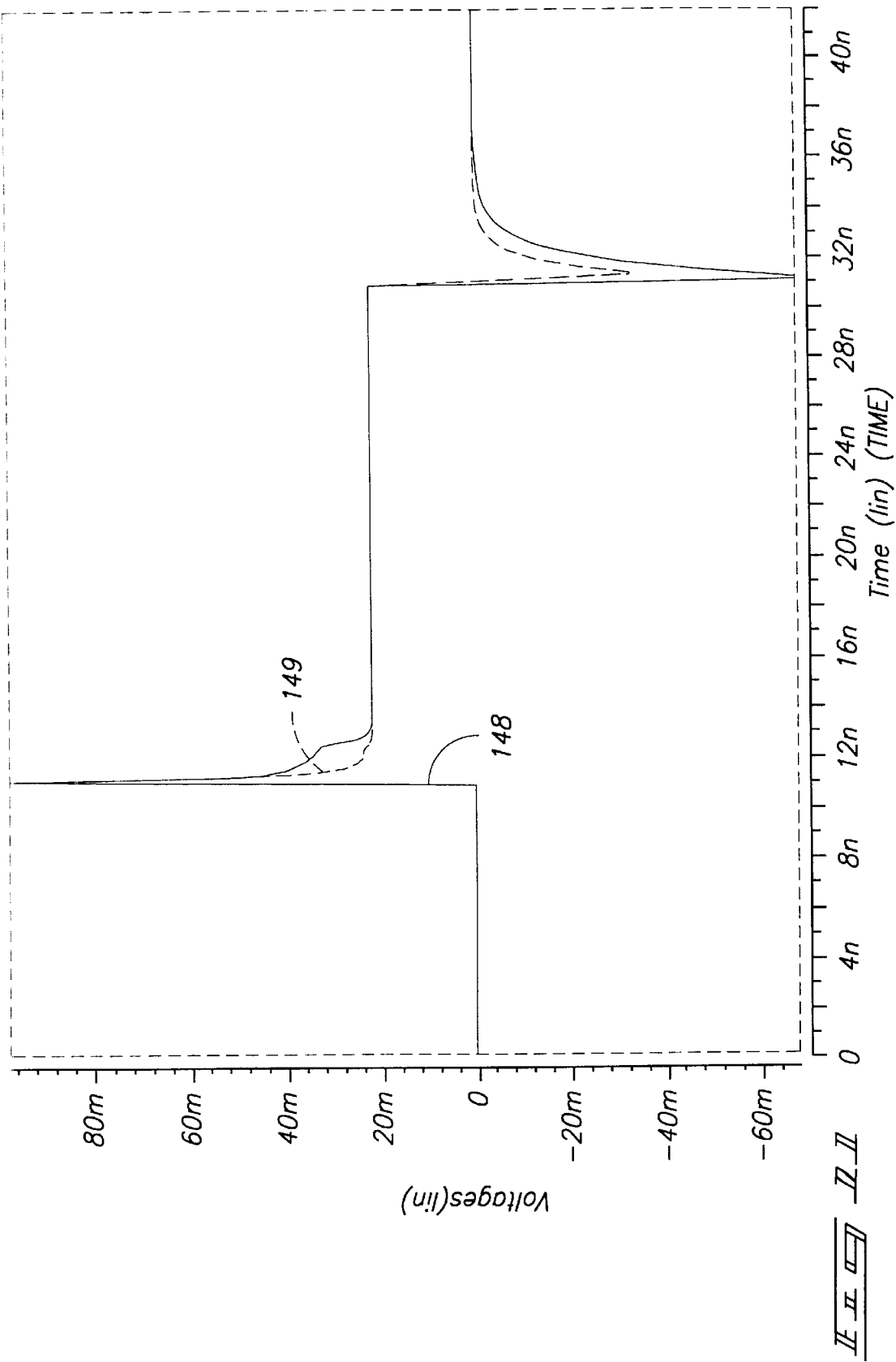

COMPARATORS AND COMPARISON METHODS

TECHNICAL FIELD

The present invention relates to comparators, memory devices, comparison methods and memory reading methods.

BACKGROUND OF THE INVENTION

A conventional track and latch comparator is shown in FIG. 1. The signals to be compared are received in the INPUT− and INPUT+ nodes of the depicted comparator. The strobe input controls tracking and latching for evaluation of the input signals. Following the latching, the comparison result is available at the OUT− and OUT+ nodes for observation.

Another conventional track and latch comparator configuration is shown in FIG. 2. The depicted track and latch comparator of FIG. 2 includes NMOS devices M11 and M22 provided in parallel with devices M1, M2, respectively. Devices M11, M22 are controlled by the respective INPUT− and INPUT+ signals which are to be compared. The strobe node again controls the tracking and latching of the depicted track and latch comparator configuration. The result of the comparison is available at the OUT+ and OUT− terminals.

The track and latch comparator configurations illustrated in FIG. 1 and FIG. 2 provide adequate operation in balanced environments. More specifically, the depicted configurations of FIG. 1 and FIG. 2 can be utilized where input impedances of the comparator (input and reference) match and where the outputs have minimum loading. Such applications are typically not present in conventional memory environments where numerous comparators share a common reference signal.

Track and latch comparators have been utilized in such memory environments to provide comparison of a read value from a memory storage device with a reference voltage. Such is utilized to determine whether the stored information corresponds to a logical high or a logical low value. Memory devices typically consist of a plurality of rows and a plurality of columns forming an array of memory storage locations. Data is written to the memory storage device during programming of the memory device. Individual rows usually have one associated comparator. Further, one reference voltage is provided for a whole memory device array and associated comparators in typical configurations.

Accordingly, the input impedances to the comparators are unbalanced inasmuch as one reference is used for individual comparators. Kickback noise or voltages fed into the reference device and data device (memory storage location) are different. The kickback effect on the reference device is cumulative corresponding to the number of comparators. For example, if thirty-two comparators are utilized in association with the memory array, a kickback effect on the reference source is thirty-two times worse than the kickback effect experienced by one of the data devices. Kickback noise can adversely impact the sensitivity of the associated comparator resulting in read error when small differential voltages are being analyzed.

In addition, clocks may be utilized in track and latch comparator configurations for reading data stored within the memory device. Clocks are typically utilized in such track and latch configurations to time the tracking and evaluation or comparison of the inputs. Kickback noise has been observed to be most severe during clock switching to the point of affecting the resolution of the comparator device.

Further, during evaluation or latching, additional sources of kickback noise or feed-through are output drivers of the comparator device. More specifically, during switching of the output drivers of the comparator, kickback noise couples with the comparator latching circuitry which couples back with the inputs to the comparator.

Points of current injection into a comparator stage of a conventional track and latch comparator are additional sources of kickback noise. During the evaluation of input signals, current redistribution on the current injection nodes creates a large voltage disturbance which feeds through directly to the comparator inputs. One conventional solution has been to reduce the injection current. Such may be implemented by reducing the width of converter MOS devices. However, this has been observed to lead to a severe mismatching problem on the inputs of the comparator.

Therefore, a need exists to provide improved comparator configurations and methods of comparing two input signals.

BRIEF DESCRIPTION OF THE DRAWINGS

Preferred embodiments of the invention are described below with reference to the following accompanying drawings.

FIG. 3 is a schematic representation of an exemplary memory device according to one aspect of the present invention.

FIG. 4 is a functional representation of stages of an exemplary comparator configuration.

FIG. 5 is a schematic representation of an exemplary input stage of the comparator shown in FIG. 4.

FIG. 12 is a graphical representation illustrating additional details of the waveforms shown in FIG. 11.

FIG. 13 is another graphical representation of waveforms corresponding to input signals to the comparator.

FIG. 14 is a graphical representation of a waveform corresponding to a reference input signal.

FIG. 18 is a graphical representation of a waveform corresponding to an output of the comparator.

DETAILED DESCRIPTION OF THE PREFERRED EMBODIMENTS

Figure 1:
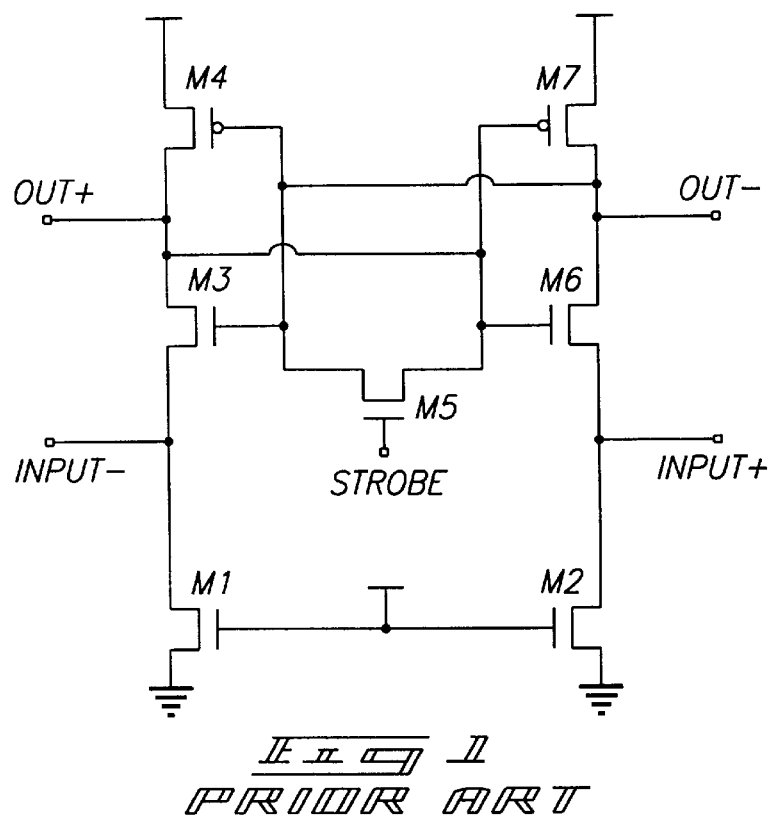
FIG. 1 is a schematic representation of a conventional track and latch comparator configuration.
Figure 2:
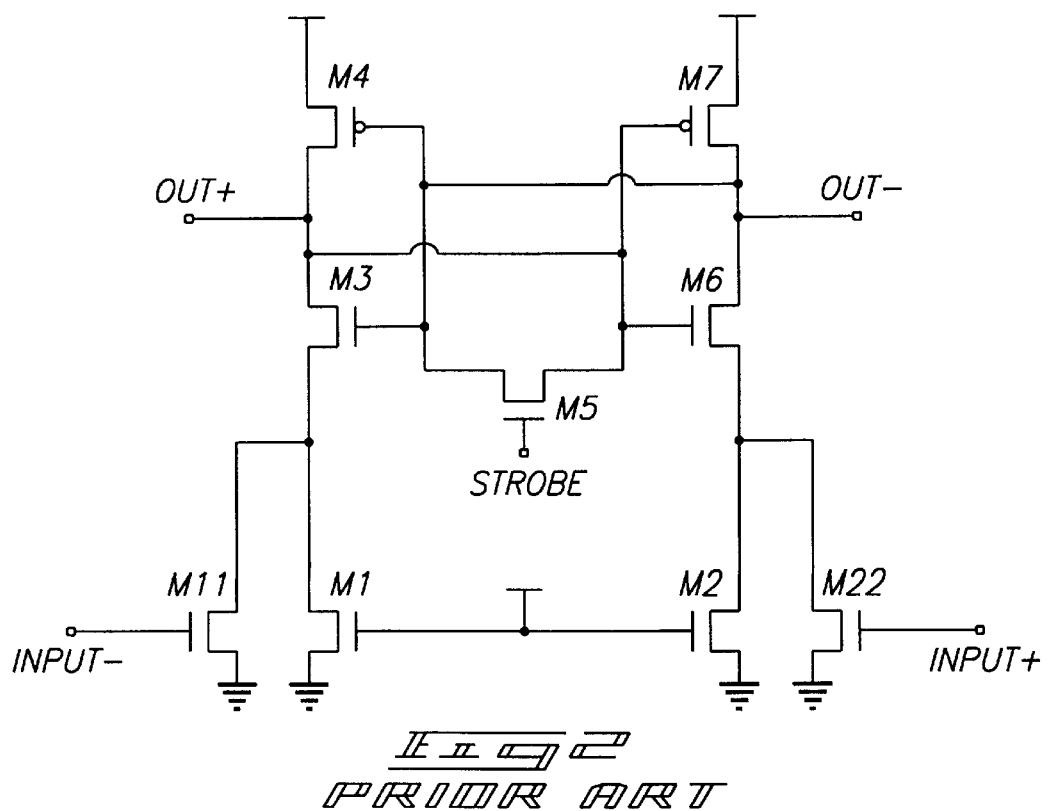
FIG. 2 is a schematic representation of another conventional track and latch comparator configuration.

This disclosure of the invention is submitted in furtherance of the constitutional purposes of the U.S. Patent Laws "to promote the progress of science and useful arts" (Article 1, Section 8).

According to one aspect of the invention, a comparator comprises: an input stage having a plurality of outputs, a data input adapted to receive a data voltage signal, a reference input adapted to receive a reference voltage signal, and a plurality of current sources individually coupled with one of the data input and the reference input and individually configured to convert one of the data voltage signal and the reference voltage signal to a differential current signal, the plurality of current sources being further configured to provide the differential current signals at the outputs; a comparator stage coupled to the outputs of the input stage and configured to compare the differential current signals, the comparator stage including: a latch portion having an output and being configured to provide an output signal indicative of the comparison of the differential current signals at the output of the latch portion; and a control portion having injection nodes and being configured to receive the differential current signals at respective ones of the injection nodes, to maintain substantially constant voltages at the injection nodes during the comparison, and to control the latch portion responsive to the differential current signals; and an output stage having an input coupled to the output of the latch portion to receive the output signal from the comparator stage, and to output the output signal after the comparison of the data signal and the reference signal.

Another aspect provides a comparator comprising: an input stage having a data input adapted to receive a data voltage signal, a reference input adapted to receive a reference voltage signal, and a plurality of current sources individually coupled with one of the data input and the reference input and individually configured to convert one of the data voltage signal and the reference voltage signal to a differential current signal and to output the differential current signal; and a comparator stage including a plurality of inputs configured to receive the differential current signals from the input stage and the comparator stage being configured to compare the differential current signals and to output an output signal indicative of a comparison of the differential current signals.

Another aspect includes a comparator comprising: an input stage adapted to receive a data signal and a reference signal; and a comparator stage configured to compare the data signal and the reference signal and including: a latch portion configured to output an output signal indicative of the comparison of the data signal and the reference signal; and a control portion configured to receive the data signal and the reference signal at respective injection nodes, to maintain substantially constant voltages at the injection nodes during the comparison, and to control the latch portion responsive to the data signal and the reference signal.

According to another aspect, the invention provides a comparator comprising: a comparator stage adapted to receive an input signal and a data signal, to compare the input signal and the data signal, and to generate an output signal indicative of the comparison; and an output stage configured to receive the output signal from the comparator and to output the output signal after the comparison of the data signal and the reference signal.

Another aspect provides a memory device comprising: a controller configured to output a plurality of address signals; a plurality of addressable memory locations individually configured to electrically store a data signal and to selectively output the data signal responsive to the address signals; and a comparator including: an input stage coupled with at least one of the addressable memory locations and configured to receive the data signal from the at least one addressable memory location and a reference voltage signal; and a comparator stage configured to compare the data signal with the reference voltage signal and to output an output signal indicative of the comparison, the comparator stage being further configured to provide reduced kickback noise at the input stage.

Another aspect provides a comparator comprising: an input stage including: a plurality of wide transistor devices configured to receive a data voltage signal and a reference voltage signal; and a plurality of differential current sources individually coupled with one of the wide transistor devices and individually configured to convert one of the data voltage signal and the reference voltage signal to a differential current signal, the differential current sources being further configured to output the differential current signals; a track and latch comparator stage coupled with the input stage and including: a latch portion configured to output an output signal indicative of a comparison of the differential current signals; and a control portion configured to receive the differential current signals at respective injection nodes, to control the latch portion to provide a comparison of the differential current signals responsive to the differential current signals, and to maintain substantially constant voltages at the individual injection nodes during the comparison; and an output stage configured to receive the output signal from the comparator stage and to output the output signal after the comparison of the data signal and the reference signal and an elapse of a predefined length of time.

Another aspect of the invention provides a comparison method comprising the steps of: providing a data voltage signal; providing a reference voltage signal; converting the data voltage signal and the reference voltage signal to differential current signals; injecting the differential current signals into a comparator at respective injection nodes; comparing the differential current signals using the comparator; maintaining the respective injection nodes at substantially constant voltages during the comparing; generating an output signal indicative of the comparing; and outputting the output signal after the comparing.

Another comparison method comprises the steps of: providing a data voltage signal; providing a reference voltage signal; injecting the data voltage signal and the reference voltage signal into a comparator at respective injection nodes; comparing the data voltage signal and the reference voltage signal using the comparator; maintaining the respective nodes at substantially constant voltages during the comparing; and generating an output signal indicative of the comparing.

A memory reading method according to one aspect comprises the steps of: storing data signals in a plurality of addressable locations; addressing at least some of the addressable locations; receiving a data signal in an input stage of a comparator; receiving a reference signal in the input stage; providing the data signal and the received reference signal as differential current signals; comparing the differential current signals using a comparator stage of the comparator; and outputting an output signal indicative of the comparing.

Referring to FIG. 3, an exemplary memory device 10 according to one aspect of the present invention is illustrated. The depicted memory device 10 comprises an array 12 of addressable memory locations 14, a controller 16, a reference device 22, and plural comparators 30. Array 12 includes a plurality of rows and columns which define individual addressable memory locations 14 as illustrated. Although only two rows and three columns of addressable memory locations 14 are shown in FIG. 3, memory device 10 can include more or less rows and columns of such addressable memory locations.

Addressable memory locations 14 are individually configured to store information. In one example, memory device 10 comprises a one-time programmable, read-only memory (ROM) device. Other configurations of memory device 10, such as random access memory (RAM), are provided according to other aspects of the invention.

During write operations, data is written to addressable memory locations 14 using write circuitry (including row decoder circuitry and a write current source). Such can include burning a read-only memory device in an exemplary aspect. Controller 16 is operable in the described embodiment to control such write operations.

Following such programming of memory device 10, individual addressable memory locations 14 are selectively addressed to recall such stored data. More specifically, controller 16 is configured to output a plurality of address signals. Addressable memory locations 14 are configured to output electrically stored data responsive to corresponding appropriate address signals outputted from controller 16. Controller 16 can include row decoder circuitry and column decoder circuitry to selectively address desired addressable memory locations 14 within memory array 12.

As illustrated, comparators 30 are individually associated with a respective row of addressable memory locations 14 within memory array 12. Individual comparators 30 are coupled with the associated row of addressable memory locations 14 as well as reference device 22. Comparators 30 are configured to compare data signals from memory array 12 with a reference signal from reference device 22. Responsive to such comparisons, comparators 30 can output information corresponding to data stored within addressable memory locations 14.

For example, individual comparators 30 can receive a data signal from an addressable memory location 14 and compare such received data signal to the reference signal. Responsive to the comparison, comparators 30 output the corresponding data including a logical one or logical zero from the associated addressable memory location 14. More specifically, if the received data from memory array 12 is greater than the reference signal, a logical high data signal is outputted from comparator 30. On the other hand, if the received data from addressable memory location 14 is less than the received reference signal, comparator 30 outputs a logic low value. As shown in the illustrated embodiment, a single reference signal generated within reference device 22 is applied to individual comparators 30 for comparison operations.

Referring to FIG. 4, details of an exemplary configuration of comparator 30 are illustrated. As shown, comparator 30 includes an input stage 32, a comparator stage 34 and an output stage 36. The input stage 32 has inputs including nodes 38, 39 and outputs including nodes 40, 41.

Although not shown in FIG. 4, nodes 38, 39 of input stage 32 are individually coupled with a row of addressable memory locations 14 and reference device 22, respectively. Input nodes 38, 39 are configured to receive a data signal and a reference voltage signal from addressable memory locations 14 and reference device 22, respectively. Nodes 40, 41 provide outputs of input stage 32 and are coupled with comparator stage 34 in the depicted configuration.

Nodes 40, 41 provide inputs of comparator stage 34. Comparator stage 34 is configured to compare the data signal received via nodes 38, 40 with the reference voltage signal received via nodes 39, 41. Responsive to the comparison, comparator stage 34 outputs at least one output signal indicative of the comparison using nodes 42, 43. Nodes 42, 43 provide outputs of comparator stage 34 and are coupled with output stage 36.

In the described configuration, output stage 36 outputs at least one output signal using a node 45 as an output. The output signal indicates the data stored within a corresponding addressable memory location. The output signal typically comprises a logical high signal or logical low signal. Further details regarding input stage 32, comparator stage 34 and output stage 36 of the depicted configuration of comparator 30 are described below in detail.

Referring to FIG. 5, an exemplary configuration of input stage 32 is shown. Input stage 32 includes PMOS devices 50, 51, 52 and NMOS devices 54, 55, 56, 57 arranged as shown. Device 50 operates as a current mirror whose gate is driven by a 100 $\mu$A bias signal applied to a node 60. NMOS device 54 is coupled with current mirror PMOS device 50 and is controlled via a control signal applied to a node 61. NMOS device 54 operates as a switch to selectively couple current mirror PMOS device 50 with the remaining circuitry of input stage 32. NMOS device 55 operates as a power-down switch which is controlled via a control signal applied to a node 62. Power-down device 55 operates to selectively ground the signal flowing through switching device 54. Controller 16 (shown in FIG. 3) generates control signals applied to nodes 60, 61, 62 in the described embodiment.

Signals passing through switching device 54 are selectively applied to differential pairs 70, 71. Differential pair 70 includes PMOS device 51 and NMOS device 56. Differential pair 71 includes PMOS device 52 and NMOS device 57. PMOS devices 51, 52 provide differential pair input devices in the depicted configuration.

A gate of PMOS device 51 is coupled with node 38. Node 38 provides a data input configured to receive a data input signal from an appropriate addressable memory location within the memory array described above. A gate of PMOS device 52 is coupled with node 39. Node 39 provides a reference input configured to receive a reference input signal from the reference device described above.

In the described configuration, PMOS devices 51, 52 individually comprise a wide or large device configured to reduce the effects of offset voltage. For example, within exemplary 0.25 micron technology, wide PMOS devices 51, 52 can have channel dimensions of 0.3 microns (or larger) by 0.3 microns (or larger).

PMOS devices 51, 52 are coupled with respective NMOS devices 56, 57. In the illustrated configuration, NMOS devices 56, 57 provide active load differential high gain current sources. NMOS device 56 is coupled with node 40 and NMOS device 57 is coupled with node 41. Differential current signals are applied from NMOS devices 56, 57 via nodes 40, 41 to comparator stage 34 (FIG. 4).

NMOS devices 56, 57 provide a differential current output stage within input stage 32 of comparator 30. The depicted input stage 32 is configured as a buffer and includes current source NMOS devices 56, 57 which convert low voltage input signals (e.g., few mV) into differential current sourcing output signals.

The depicted configuration of input stage 32 significantly reduces kickback effects from comparator stage 34 and input nodes 38, 39. In the depicted configuration, the differential input stage 32 has a differential gain of close to unity (i.e., the differential input is level-shifted and the buffered differential voltage is kept substantially the same as the input). The described configuration converts differential input voltage signals into differential current sources and provides immunity to kickback by utilizing high impedance current sources.

Figure 6:
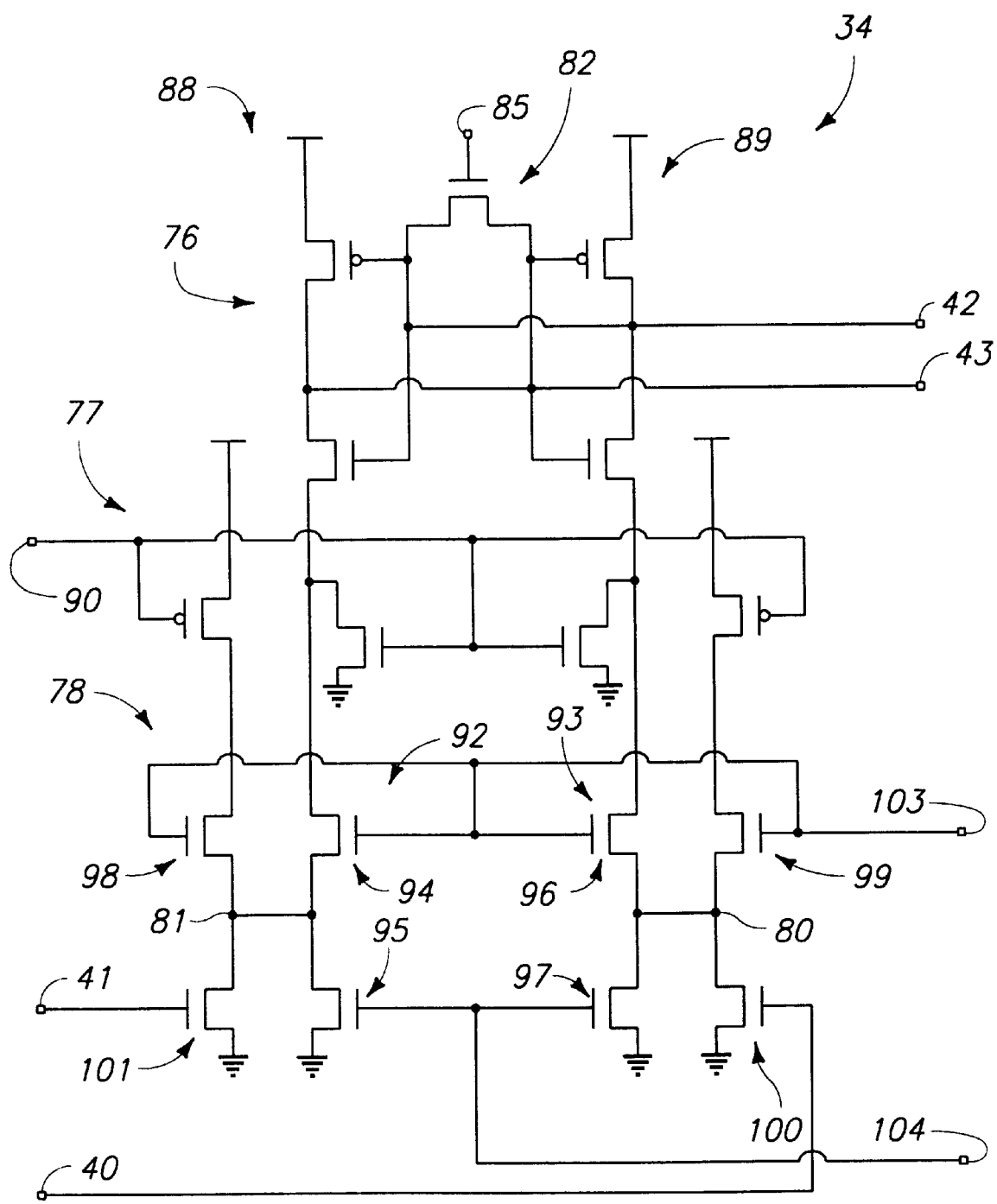
FIG. 6 is a schematic representation of an exemplary comparator stage of the comparator shown in FIG. 4.

Referring to FIG. 6, an exemplary configuration of comparator stage 34 is shown. Comparator stage 34 is configured to compare the differential current signals outputted from input stage 32. The depicted comparator stage 34 includes a latch portion 76, a switch portion 77 and a control portion 78. The depicted comparator stage 34 is configured as a closed-loop current comparator, also referred to as a track and latch comparator.

As described in further detail below, latch portion 76 is configured to output an output signal indicative of a comparison of the differential current signals from input stage 32. Control portion 78 receives such differential current signals at respective injection nodes 80, 81 and maintains substantially constant voltages at the individual injection nodes during a comparison of the data signal and the reference signal. Such provides reduced kickback noise at the input stage. Control portion 78 controls latch portion 76 responsive to the injected differential current signals.

Latch portion 76 includes plural inverter configurations 88, 89. Inverters 88, 89 provide an OUT− signal and an OUT+ at nodes 42, 43 which form outputs of comparator stage 34. A switch 82 is provided intermediate inverters 88, 89. A strobe signal provided from controller 16 via an input 85 controls the operation of switch 82 and comparator stage 34 as described below.

Switch portion 77 receives a read_n control signal from controller 16 at an input 90. Responsive to the read_n control signal, the illustrated devices of switch portion 77 operate to selectively couple latch portion 76 with control portion 78.

Control portion 78 includes cascode current mirror configurations 92, 93 which include NMOS devices 94, 95 and NMOS devices 96, 97, respectively. A 50 µA biasing signal is applied to the gates of NMOS devices 95, 97 in the described configuration via a node 104. Controller 16 supplies the biasing signal to node 104 in the described embodiment.

Control portion 78 further includes NMOS devices 98, 99 configured as steering devices in the described arrangement. A 50 µA biasing signal is applied to the gates of steering devices 98, 99 in the described configuration via a node 103. Controller 16 can provide the appropriate biasing signal to node 103.

Current mirror configurations 92, 93 an d steering devices 98, 99 operate as an anchor mechanism to minimize voltage deviations at nodes 80, 81. Such provides dramatic reduction of switching noise on both nodes 80, 81 which reduces kickback noise.

The gates of NMOS devices 100, 101 are coupled with respective nodes 40, 41 which provide inputs of comparator stage 34. More specifically, nodes 40, 41 are configured to communicate the differential current signals from differential current sources 56, 57, respectively. NMOS devices 100, 101 form current mirrors with respective active load differential current sources 56, 57 of input stage 32. NMOS devices 100, 101 are utilized for current injection and are configured to inject the differential current signals to nodes 80, 81. Current mirrors comprising devices 56, 100 and 57, 101 are configured to communicate the differential current signals from input stage 32 to comparator stage 34.

During tracking operations of comparator stage 34, the current of NMOS devices 94, 98 is equal to the current within NMOS devices 95, 101. Similarly, the current of NMOS devices 96, 99 is equal to the current within NMOS devices 97, 100 during tracking. Respective voltages are established at nodes 80, 81. When comparator stage 34 latches corresponding to a comparison operation, NMOS devices 94, 96 pass substantially reduced current. It is desired to maintain substantially constant voltages at nodes 80, 81 during the tracking and latching to reduce kickback noise within input stage 32. Steering devices 98, 99 operate to carry additional current to compensate for NMOS devices 94, 96 conducting reduced current to maintain injection nodes 80, 81 at a substantially constant voltage during comparison of the differential current signals.

Latch stage 76 is configured to output at least one output signal indicative of a comparison of the differential current signals using nodes 42, 43 as outputs. In the described configuration, the signal outputted via node 43, corresponding to an OUT+ signal, is utilized as the output signal. A signal outputted using node 42 corresponds to an OUT− signal and is used as a dummy signal in the described configuration. Plural signal paths to nodes 42, 43 are utilized to provide proper balancing.

Figure 7:
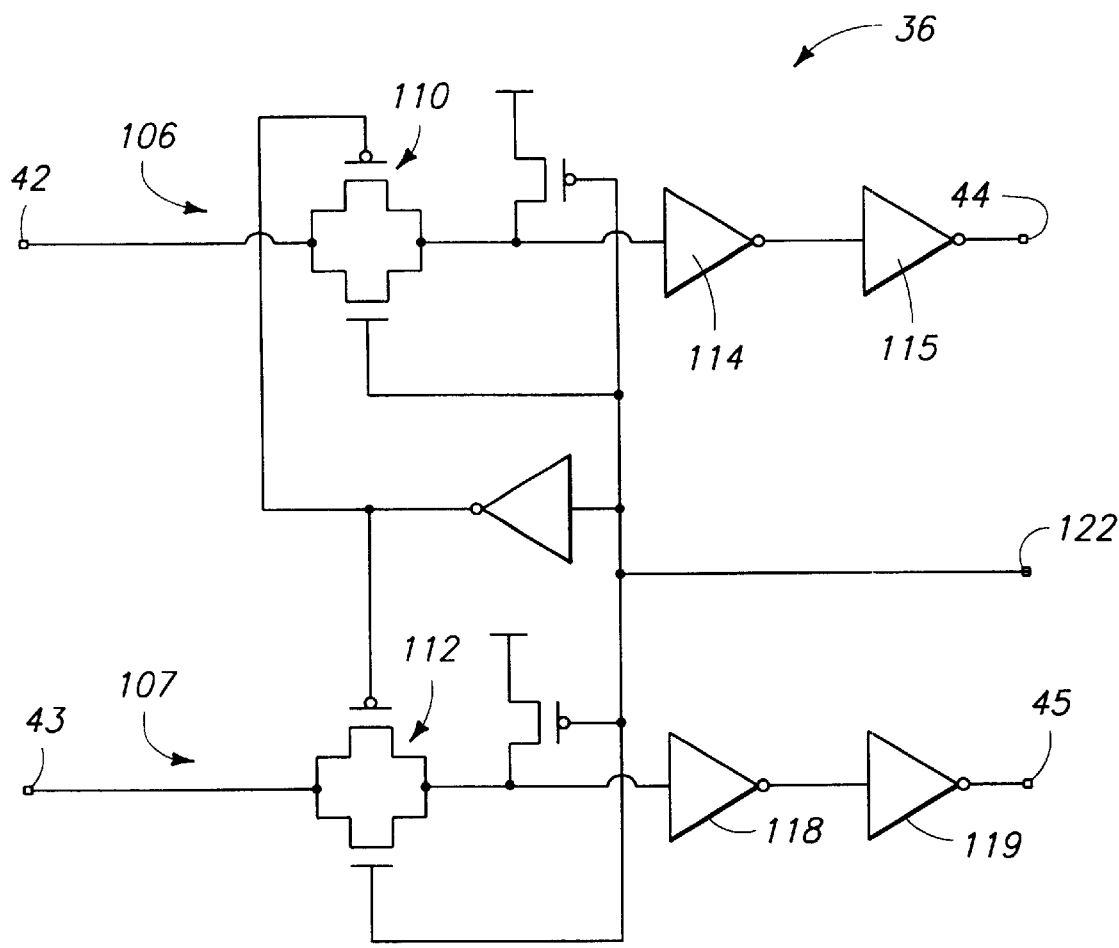
FIG. 7 is a schematic representation of an exemplary output stage of the comparator shown in FIG. 4.

Referring to FIG. 7, an exemplary configuration of output stage 36 of comparator 30 is shown. Nodes 42, 43 provide inputs for the OUT− signal and OUT+ signal, respectively, to output stage 36. The depicted output stage 36 includes plural switches 110, 112 configured as pass gates in the described embodiment. Switch 110 is coupled with drivers 114, 115 and an output node 44. Switch 112 is coupled with drivers 118, 119 and output node 45 providing a data output.

Output stage 36 includes plural output paths 106, 107 which are utilized for balancing purposes. Path 106 is not utilized for comparison in the described arrangement and provides a dummy output signal at node 44. Path 107 provides the output of comparator 30 and output stage 36 at node 45 in the described embodiment.

Nodes 42, 43 are selectively de-coupled from respective drivers 114, 115 and 118, 119 through utilization of path switches 110, 112. During evaluation or latching of the data signal and the reference signal, kickback noise from drivers 114, 115, 118, 119 can alter comparison results within comparator stage 34. Accordingly, switches 110, 112 operate to selectively de-couple nodes 42, 43 from drivers 114, 115, 118, 119 to provide increased sensitivity and accuracy during comparison operations. In other words, switches 110, 112 operate to selectively electrically insulate comparator stage 34 from drivers 114, 115, 118, 119.

More specifically, kickback noise from the output driver can reduce the comparison sensitivity of comparator stage 34 during the latching phase by introducing kickback noise on the comparator inputs. Switches 110, 112 operate to de-couple nodes 42, 43 from drivers 114, 118 during the latching phase of comparator stage 34. Following the latching of the data signal and the reference signals, switches 110, 112 couple nodes 42, 43 and drivers 114, 118. Thus, kickback from the drivers 114, 118 is postponed to a point when comparator stage 34 has already finished evaluating the data signal and the reference signal (i.e. finished the comparing and latching operations).

As described below, switches 110, 112 are controlled via a strobe delay control signal strb_del from controller 16 and applied at a node 122. The control signal provided to node 122 is timed to selectively delay the coupling of nodes 42, 43 with the respective drivers 114, 118. The output signals present at nodes 42, 43 are applied to associated drivers 114, 118 after comparison of the data signal and the reference signal within comparator stage 34.

In the described embodiment, controller 16 is configured to time a predefined length of time after the comparison of the differential signals and thereafter couple nodes 42, 43 with respective drivers 114, 118. As illustrated, the control signal applied via node 122 from controller 116 controls the outputting of the output signals received via nodes 42, 43 from comparator stage 34. The output signals are outputted (i.e., available at nodes 44, 45) after the timing the predefined length of time.

Figure 8:
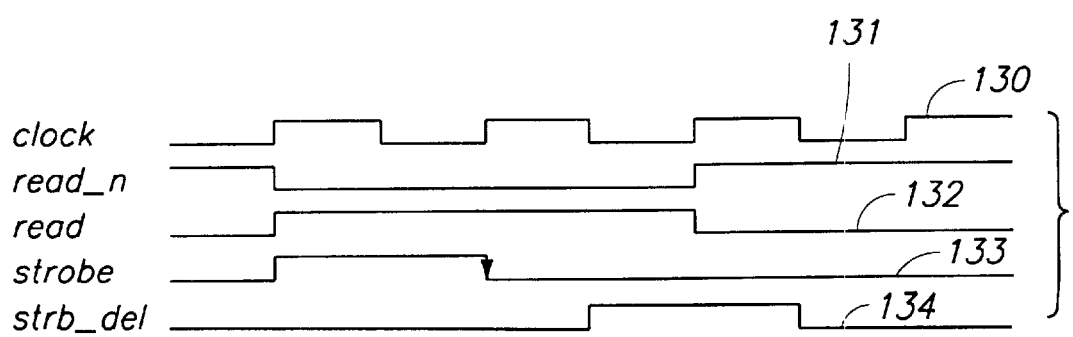
FIG. 8 is a timing diagram illustrating various signals for controlling the comparator shown in FIG. 4.

Referring to FIG. 8, timing of control signals within comparator 30 is described. Signal 130 represents a clock signal generated by controller 16 and utilized for timing within comparator 30. Signal 131 represents a read__n signal generated by controller 16. Signal 132 is a read signal generated by controller 16. Signal 133 is a strobe signal generated by controller 16. Signal 134 is a strb__del signal generated by controller 16. Signal 131 is applied from controller 16 to node 90 of FIG. 6. Signal 132 is applied to node 61 of FIG. 5. Signal 133 is applied to node 85 of FIG. 6. Signal 134 is applied to node 122 of FIG. 7.

Timing in accordance with FIG. 8 provides increased sensitivity of comparator 30 and reduced kickback. Comparator 30 is turned on by signals 131, 132 for two clock cycles. Tracking of comparator 30 is turned on for one cycle by signal 133. Comparator 30 latches or evaluates on the falling edge of signal 133. Thereafter, for approximately one-half clock cycle, comparator stage 34 is de-coupled from drivers 114, 118 of output stage 36. Then, switches 110, 112 are turned on by signal 134 for one clock cycle which enables the output signal to be latched externally of comparator 30 at node 45. More specifically, signals at nodes 42, 43 thereafter drive devices 114, 115 and 118, 199, respectively.

Figure 9:
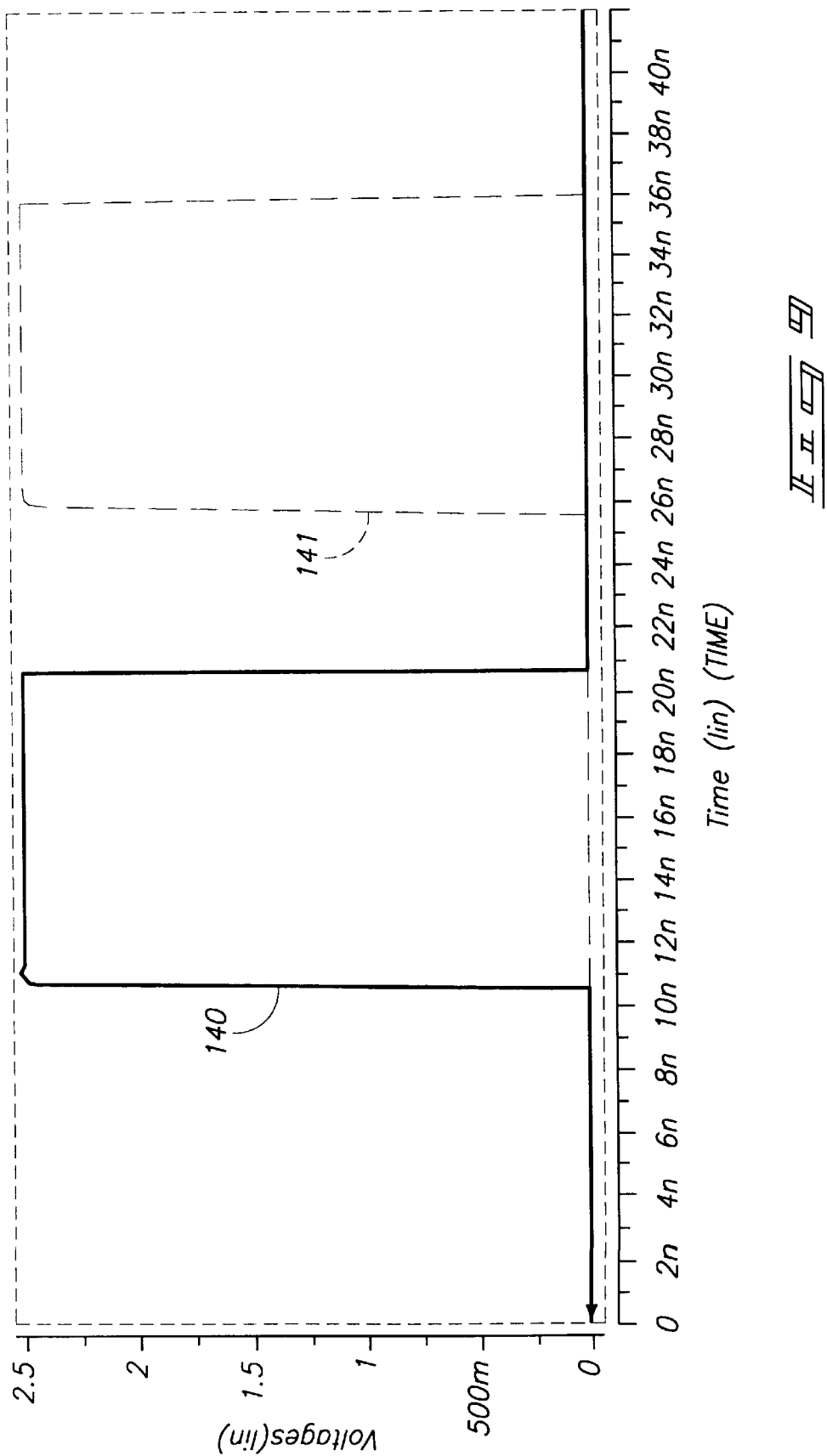
FIG. 9 is a graphical representation of waveforms corresponding to a strobe control signal and a strb_del control signal.

Referring to FIGS. 9–12, first exemplary operations of comparator 30 are illustrated. Waveforms 140, 141 are illustrated in FIG. 9 during operations of comparator 30. Waveform 140 corresponds to a strobe control signal and waveform 141 corresponds to a strb__del control signal. As shown, waveform 140 is asserted at approximately 10.5 ns to initiate a tracking operation of comparator 30. At approximately 21 ns, waveform 140 is de-asserted providing a latching operation of comparator 30.

At approximately 26 ns, waveform 141 is asserted to pass the data from an input (i.e., node 43) of output stage 36 to the output of comparator 30 (i.e., node 45). Waveform 141 is asserted after timing a predefined period of time by controller 16 corresponding to approximately 5 ns for one-half clock cycle in the described configuration.

Figure 10:
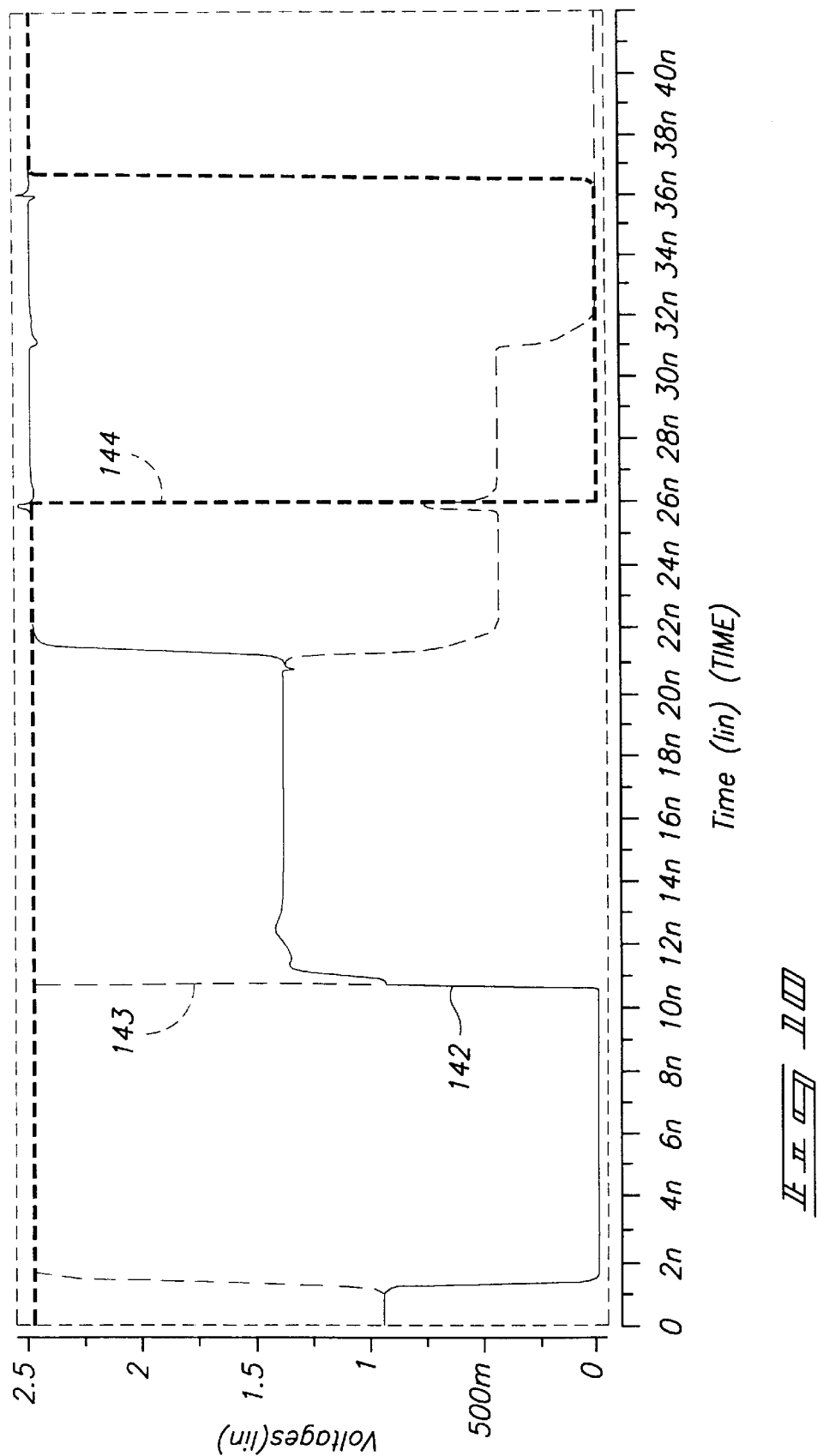
FIG. 10 is a graphical representation of waveforms corresponding to output signals of the comparator.

Referring to FIG. 10, waveforms 142, 143, 144 are shown. Waveform 142 corresponds to an output signal of comparator stage 34 at node 42. Waveform 143 corresponds to an output signal at node 43 of comparator stage 34. Waveform 144 corresponds to an output signal observed at node 45 of output stage 36.

At a time equal to approximately 11 ns, and responsive to the assertion of waveform 140 shown in FIG. 9, signals 142, 143 converge to an approximately equal voltage of 1.25 volts. At a time equal to approximately 21 ns, comparator 30 is latched and signals 142, 143 diverge responsive to the comparison of the input signals. At a time equal to approximately 26 ns, and responsive to the assertion of waveform 141 of FIG. 9, data is available at node 45 as represented by waveform 144.

Figure 11:
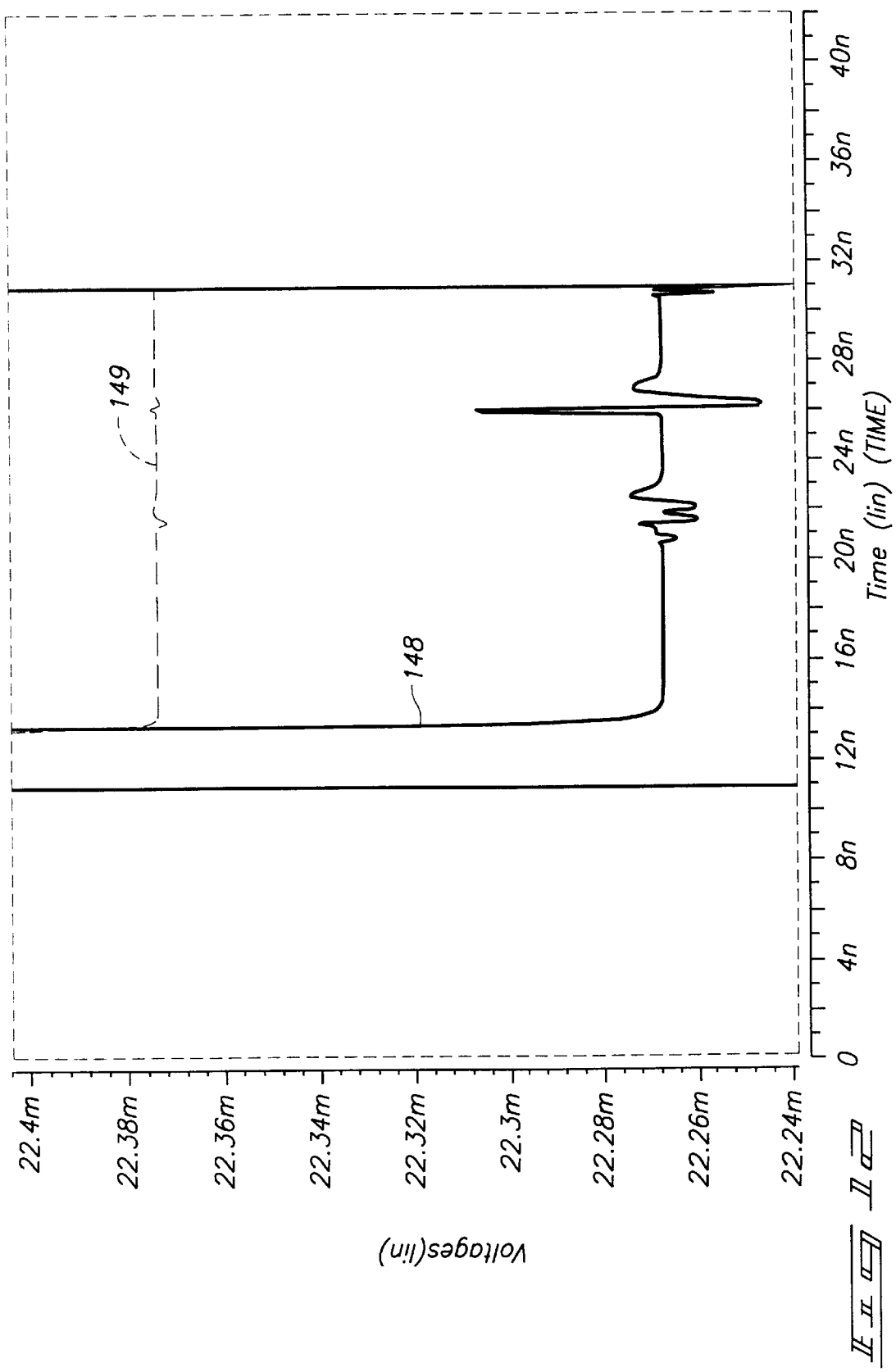
FIG. 11 is a graphical representation of waveforms corresponding to input signals applied to the comparator.
Figure 11:
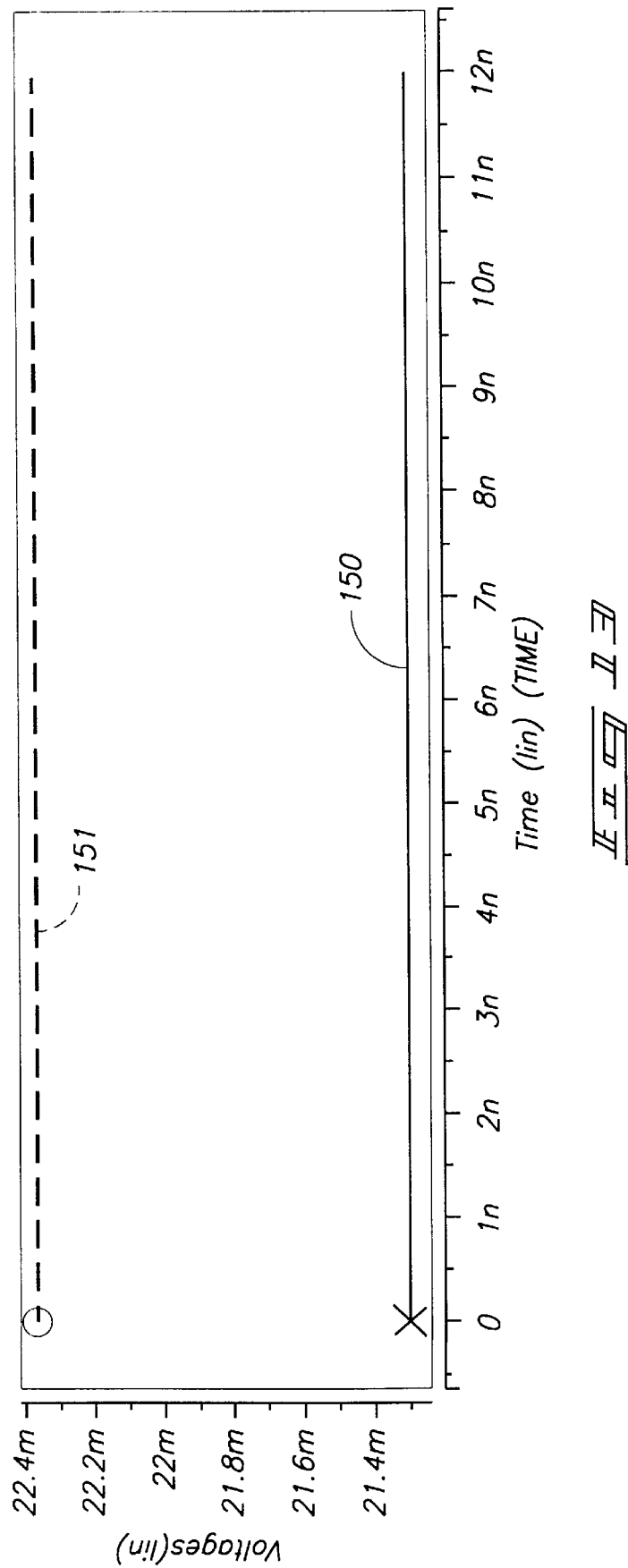
Figure 11:
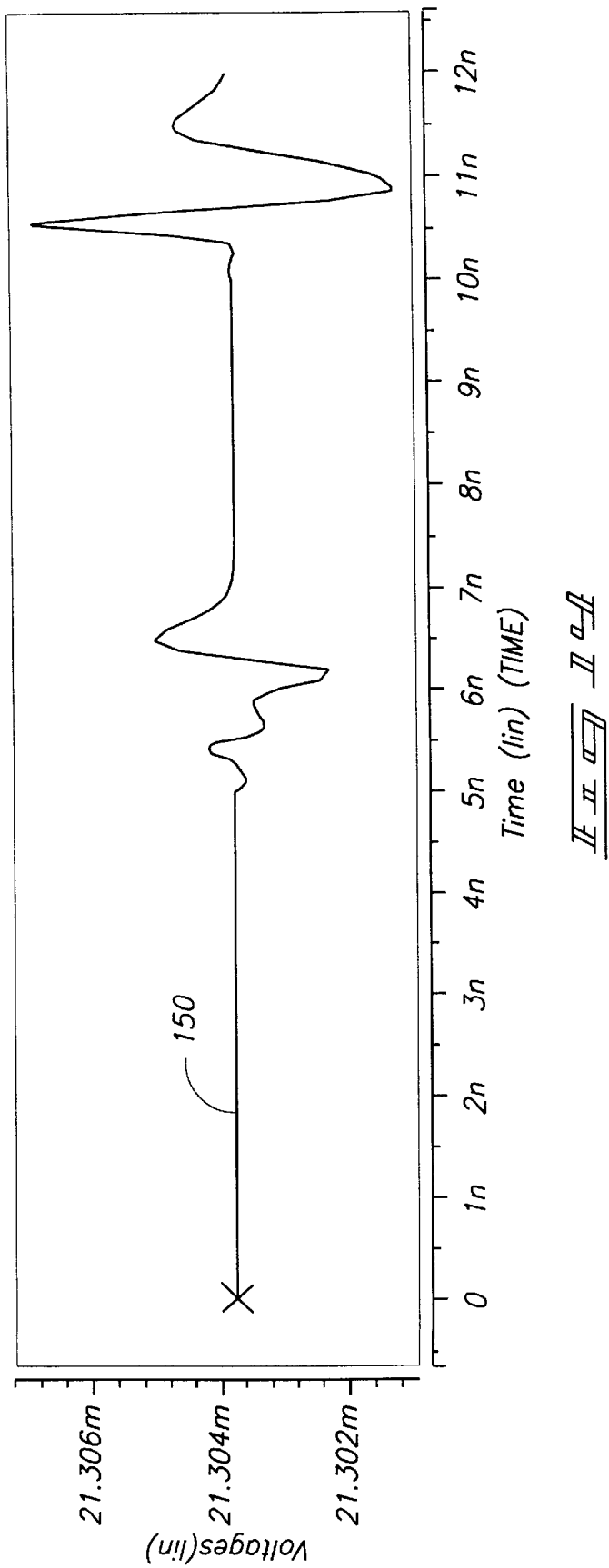

Referring to FIG. 11, waveforms 148, 149 are shown. Waveform 148 corresponds to the reference input signal applied to node 39 of comparator 30. Waveform 149 corresponds to a data input signal applied to node 38 of comparator 30. A spike of waveforms 148, 149 is shown at time equal to approximately 11 ns corresponding to the assertion of waveform 140 representing the latching of comparator 30. At a time equal to approximately 31 ns, waveforms 148, 149 experience a downward spike.

Referring to FIG. 12, further details of waveforms 148, 149 are shown. Kickback noise is observed on both input waveforms 148, 149 at approximately 20 ns and 26 ns. As illustrated, waveform 148 corresponding to the reference input signal is subjected to greater kickback noise due to the cumulative affect of applying the reference input signal to numerous comparators 30 provided in an exemplary memory device configuration. As illustrated, the kickback noise is well below 0.1 mV.

Referring to FIGS. 13–18, additional operations of comparator 30 are illustrated. Waveforms 150, 151 are shown in FIG. 13 corresponding to an input reference signal and a data input signal, respectively. FIG. 13 illustrates a 1 mV differential input at approximately 22 mV above ground level.

Referring to FIG. 14, kickback noise upon the reference input node of comparator 30 is shown. Kickback noise is illustrated at approximately 5–7 ns corresponding to assertion of a strobe control signal from the controller. Further noise is illustrated from approximately 10–12 ns corresponding to the assertion of a strb__del signal from the controller.

Figure 15:
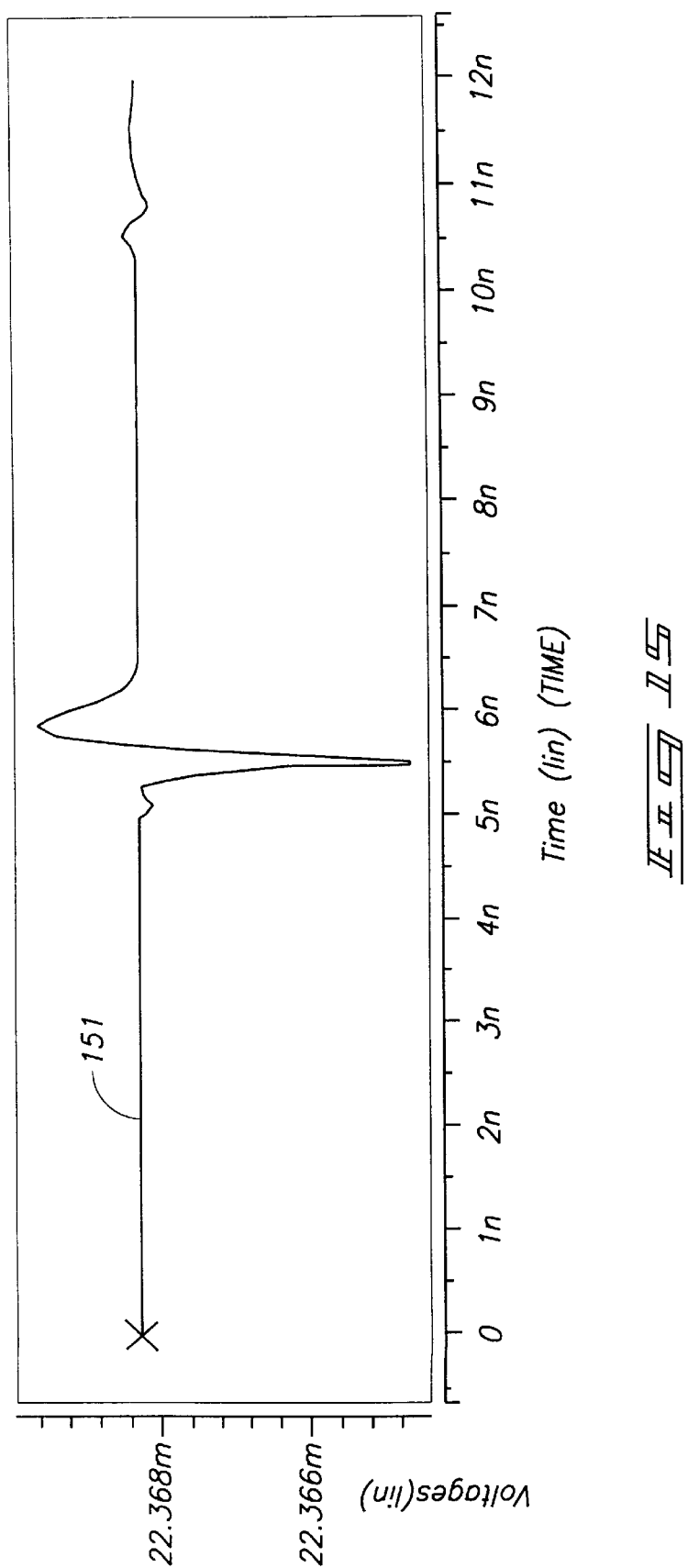
FIG. 15 is a graphical representation of a waveform corresponding to a data input signal.

Referring to FIG. 15, further details of waveform 151 are shown corresponding to kickback noise at the data input node of comparator 30. Noise is illustrated at approximately 5–7 ns corresponding to the assertion of the strobe control signal. Kickback noise is also shown at approximately 10–12 ns corresponding to the assertion of the strb__del control signal. As shown in FIGS. 14–15, the kickback noise observed at the reference input node and the data input node of comparator 30 is less than approximately 0.01 mV.

Figure 16:
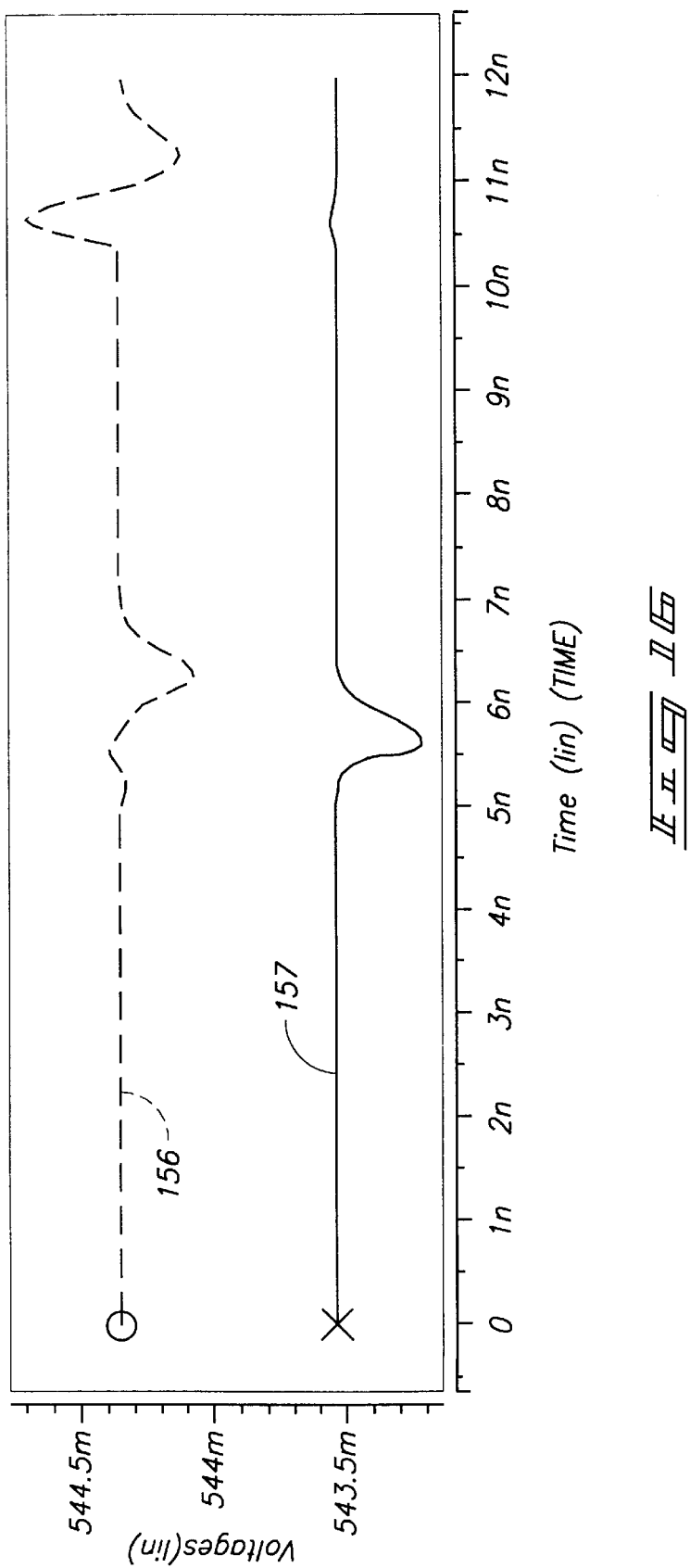
FIG. 16 is a graphical representation of waveforms corresponding to signals outputted from an input stage of the comparator.

Referring to FIG. 16, waveforms 156, 157 are shown corresponding to the outputs of input stage 32 of comparator 30. Waveform 156 corresponds to the reference signal at node 41 and waveform 157 corresponds to the data signal at node 40 of input stage 32. As illustrated, nodes 40, 41 experience kickback noise at approximately 5–7 ns corresponding to assertion of the strobe control signal. Further, kickback noise upon the signals at nodes 40, 41 is shown at approximately 10–12 ns corresponding to the assertion of the strb__del control signal. As shown, the kickback noise observed at the output nodes 40, 41 of input stage 32 is less than 0.5 mV during track and latch operations.

Figure 17:
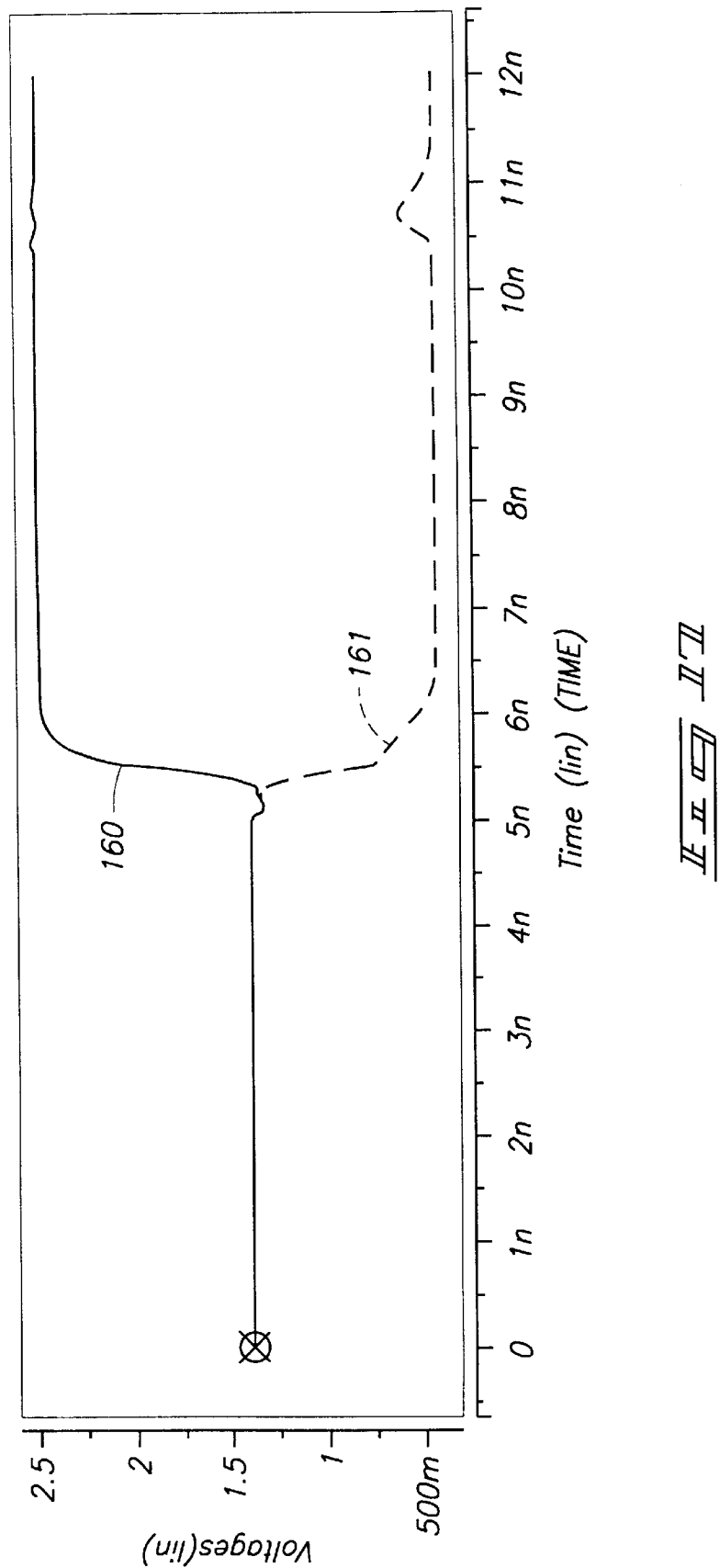
FIG. 17 is a graphical representation of waveforms corresponding to signals outputted from a comparator stage of the comparator.
Figure 11B:
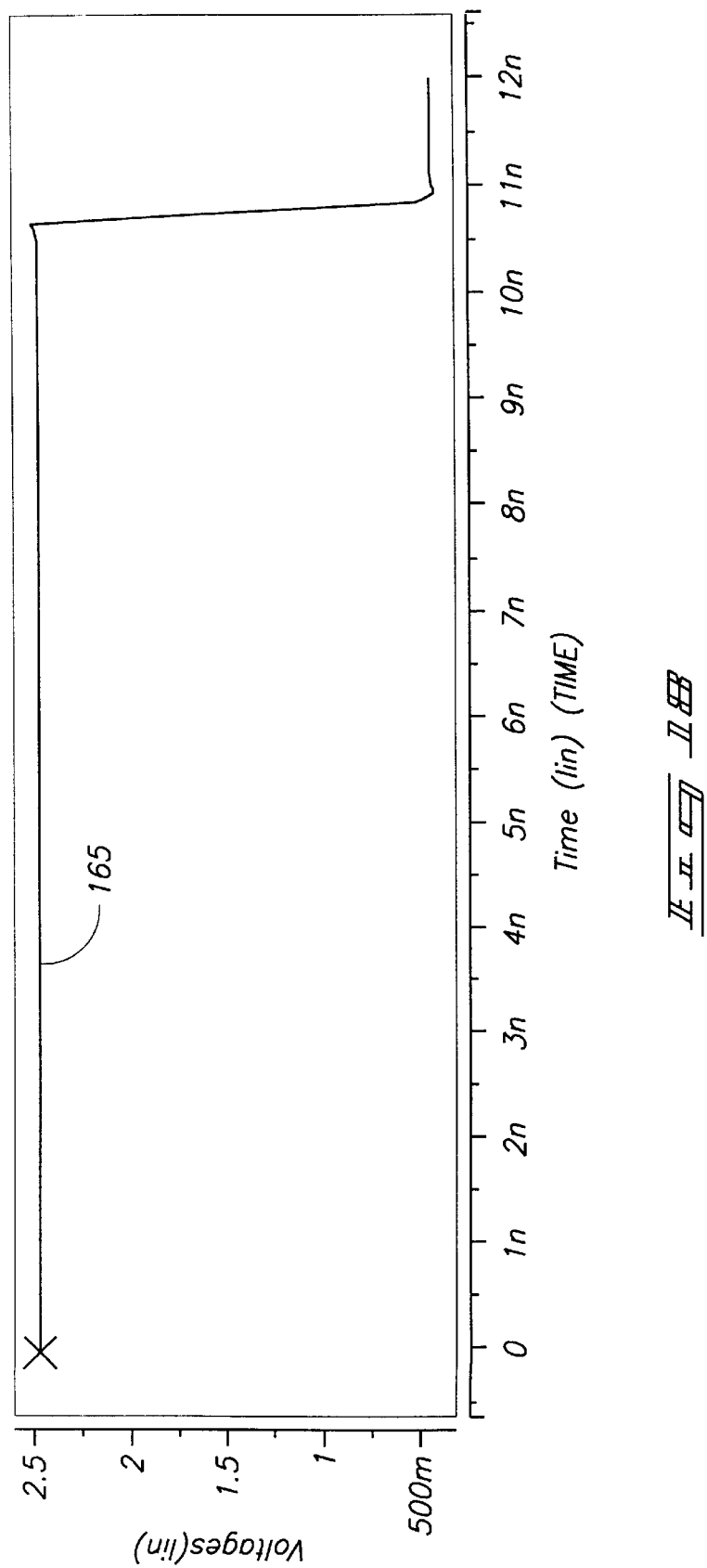

Referring to FIG. 17, waveforms 160, 161 correspond to signals observed at respective output nodes 42, 43 of comparator stage 34. During a tracking phase of comparator stage 34 from approximately 0–5 ns, output nodes 42, 43 are held at a mid-level voltage. During latching at a time equal to approximately 5 ns of comparator stage 34, waveforms 160, 161 diverge responsive to a comparison of the input signals.

Referring to FIG. 18, a waveform 165 corresponds to an output signal observed at node 45 of output stage 36. Following the assertion of the strb__del control signal at a time equal to approximately 10 ns, data previously available at node 43 is passed to node 45 as described above.

The comparator arrangement according to the present invention provides a high speed current comparator configured to provide memory read or other comparison operations. The comparator may be utilized to resolve small (e.g., $\mu V$ to mV) voltage differentials. The described comparator includes features according to some aspects to provide optimized operation in unbalanced interface applications (inputs and/or outputs) to provide reduced kickback noise. Further, the comparator described herein provides increased sensitivity and reduced offset voltage.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A comparator comprising:
   an input stage having a plurality of outputs, a data input adapted to receive a data voltage signal, a reference input adapted to receive a reference voltage signal, and a plurality of current sources individually coupled with one of the data input and the reference input and individually configured to convert one of the data voltage signal and the reference voltage signal to a differential current signal, the plurality of current sources being further configured to provide the differential current signals at the outputs;
   a comparator stage coupled to the outputs of the input stage and configured to compare the differential current signals, the comparator stage including:
      a latch portion having an output and being configured to provide an output signal indicative of the comparison of the differential current signals at the output of the latch portion; and
      a control portion having injection nodes and being configured to receive the differential current signals at respective ones of the injection nodes, to maintain substantially constant voltages at the injection nodes during the comparison, and to control the latch portion responsive to the differential current signals; and
   an output stage having an input coupled to the output of the latch portion to receive the output signal from the comparator stage, and to output the output signal after the comparison of the data signal and the reference signal.

2. The comparator according to claim 1 wherein the comparator stage comprises a track and latch comparator configuration.

3. The comparator according to claim 1 wherein the data input and the reference input individually comprise a wide transistor device.

4. The comparator according to claim 1 wherein the output stage comprises a switch configured to output the output signal after the elapse of a predefined length of time after the comparison of the differential current signals.

5. The comparator according to claim 1 wherein some components of the input stage and the comparator stage comprise current mirrors configured to communicate the differential current signals from the input stage to the comparator stage.

6. The comparator according to claim 1 wherein the control portion of the comparator stage comprises a plurality of steering devices coupled with the injection nodes and configured to maintain the substantially constant voltages at the injection nodes.

7. The comparator according to claim 1 wherein the output stage includes a driver configured to output the output signal and a switch configured to selectively insulate the comparator stage from the driver.

8. A comparator comprising:
   an input stage having a data input adapted to receive a data voltage signal, a reference input adapted to receive a reference voltage signal, and a plurality of differential current sources individually coupled with one of the data input and the reference input and individually configured to convert one of the data voltage signal and the reference voltage signal to a differential current signal and to output the differential current signal; and
   a comparator stage including a plurality of inputs configured to receive the differential current signals from the input stage and the comparator stage being configured to compare the differential current signals and to output an output signal indicative of a comparison of the differential current signals.

9. The comparator according to claim 8 wherein the data input and reference input individually comprise a wide transistor device.

10. A comparator comprising:
    an input stage adapted to receive a data signal and a reference signal; and
    a comparator stage coupled with the input stage and configured to compare the data signal and the reference signal and including:
       a latch portion configured to output an output signal indicative of the comparison of the data signal and the reference signal; and
       a control portion configured to receive the data signal and the reference signal at respective injection nodes, to maintain substantially constant voltages at the injection nodes during the comparison, and to control the latch portion responsive to the data signal and the reference signal.

11. The comparator according to claim 10 wherein the data signal and the reference signal comprise differential voltage signals and the input stage includes a plurality of differential current sources configured to convert the differential voltage signals to differential current signals.

12. The comparator according to claim 10 further comprising an output stage configured to receive the output signal from the comparator stage and to output the output signal after the comparison of the data signal and the reference signal.

13. The comparator according to claim 10 wherein the comparator stage comprises a track and latch comparator configuration.

14. The comparator according to claim 10 wherein the control portion of the comparator stage comprises a plurality of steering devices coupled with the injection nodes and configured to maintain the substantially constant voltages at the injection nodes.

15. The comparator according to claim 10 wherein the input stage and the comparator stage comprise current mirrors configured to communicate the differential current signals from the input stage to the comparator stage.

16. The comparator according to claim 10 further comprising:

a driver configured to output the output signal; and a switch configured to selectively insulate the comparator stage from the driver.

17. A comparator comprising:

a comparator stage adapted to receive a reference signal and a data signal, to compare the reference signal and the data signal, and to generate an output signal indicative of the comparison; and an output stage configured to receive the output signal from the comparator and to output the output signal after the comparison of the reference signal and the data signal.

18. The comparator according to claim 17 wherein the output stage is configured to receive a control signal and to output the output signal responsive to reception of the control signal.

19. The comparator according to claim 17 wherein the output stage comprises a switch configured to selectively output the output signal.

20. The comparator according to claim 17 wherein the output stage is configured to output the output signal after a predefined length of time after the comparison.

21. The comparator according to claim 17 wherein the output stage includes a driver configured to output the output signal and a switch configured to selectively insulate the comparator stage from the driver.

22. A comparator comprising:

an input stage including:
  a plurality of wide transistor devices configured to receive a data voltage signal and a reference voltage signal; and
  a plurality of differential current sources individually coupled with one of the wide transistor devices and individually configured to convert one of the data voltage signal and the reference voltage signal to a differential current signal, the differential current sources being further configured to output the differential current signals;

a track and latch comparator stage coupled with the input stage and including:
  a latch portion configured to output an output signal indicative of a comparison of the differential current signals; and
  a control portion configured to receive the differential current signals at respective injection nodes, to control the latch portion to provide a comparison of the differential current signals responsive to the differential current signals, and to maintain substantially constant voltages at the individual injection nodes during the comparison; and an output stage configured to receive the output signal from the comparator stage and to output the output signal after the comparison of the data signal and the reference signal and an elapse of a predefined length of time.

23. A comparison method comprising the steps of:

providing a data voltage signal;

providing a reference voltage signal;

converting the data voltage signal and the reference voltage signal to differential current signals;

injecting the differential current signals into a comparator stage at respective injection nodes;

comparing the differential current signals using the comparator stage;

maintaining the respective injection nodes at substantially constant voltages during the comparing;

generating an output signal indicative of the comparing; and outputting the output signal after the comparing.

24. The method according to claim 23 further comprising providing the comparator stage comprising a track and latch comparator.

25. The method according to claim 23 further comprising receiving the data voltage signal and the reference voltage signal using wide transistor devices.

26. The method according to claim 23 further comprising receiving a control signal and the outputting is responsive to the control signal.

27. The method according to claim 23 further comprising timing a predefined period of time after the generating and the outputting is after the timing.

28. The method according to claim 23 wherein the injecting includes injecting using a plurality of current mirrors.

29. The method according to claim 23 wherein the outputting comprises outputting using a driver, and further comprising the step of insulating the comparator stage from the driver during the comparing.

30. A comparison method comprising the steps of:

providing a data signal;

providing a reference signal;

injecting the data signal and the reference signal into a comparator stage at respective injection nodes;

comparing the data signal and the reference signal using the comparator stage;

maintaining the respective injection nodes at substantially constant voltages during the comparing; and generating an output signal indicative of the comparing.

31. The method according to claim 30 further comprising the step of converting the data signal and the reference signal to differential current signals before the injecting.

32. The method according to claim 30 further comprising the step of outputting the output signal after the comparing.

33. The method according to claim 30 further comprising the steps of:

outputting the output signal using a driver; and insulating the comparator stage from the driver during the comparing.

34. The method according to claim 30 further comprising the steps of:

timing a predefined period of time after the generating; and outputting the output signal after the timing.

35. The method according to claim 30 further comprising providing the comparator stage comprising a track and latch comparator.

* * * * *